(12) United States Patent
Hong et al.

(10) Patent No.: US 11,978,398 B2
(45) Date of Patent: May 7, 2024

(54) VIEWING ANGLE SWITCHABLE DISPLAY DEVICE

(71) Applicant: LG Display Co., Ltd., Seoul (KR)

(72) Inventors: Soon-Hwan Hong, Paju-si (KR); Seong-Yeong Kim, Paju-si (KR); Ye-Seul Han, Paju-si (KR); Jeong-Ok Jo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/977,280

(22) Filed: Oct. 31, 2022

(65) Prior Publication Data

US 2023/0215357 A1 Jul. 6, 2023

(30) Foreign Application Priority Data

Dec. 30, 2021 (KR) .................. 10-2021-0192432

(51) Int. Cl.
*G09G 3/3233* (2016.01)
*G06F 3/041* (2006.01)
(Continued)

(52) U.S. Cl.
CPC ......... *G09G 3/3233* (2013.01); *G06F 3/0412* (2013.01); *G06F 3/0446* (2019.05);
(Continued)

(58) Field of Classification Search
CPC ...... G06F 3/041–047; G06F 2203/041–04114; H10K 59/353; H10K 59/352; H10K 59/121; H10K 59/351; H10K 50/858; G09G 2300/042; G09G 3/003; G09G 2300/0465; G09G 2320/068; G09G 2320/0209; G09G 2320/028; G09G 3/3208; G09G 2320/02; G02F 1/1323; G02F 1/134381; G02B 30/27; G02B 19/0066; G02B 19/0014; G02B 27/0172; G02B 3/0056; G02B 5/201; G02B 27/0075; G02B 26/08; G02B 27/0955; G02B 19/0061; G02B 2006/12102; G02B 30/28; G02B 3/00; G02B 30/30; G02B 5/04; G02B 3/06
See application file for complete search history.

(56) References Cited

U.S. PATENT DOCUMENTS

2015/0145907 A1* 5/2015 Ryu ..................... G09G 3/3233
345/697
2015/0332628 A1* 11/2015 Ren ..................... G09G 3/3258
345/83

(Continued)

FOREIGN PATENT DOCUMENTS

CN 111063706 A * 4/2020 ............. G06F 3/041
CN 111883684 B * 8/2022 ........... H01L 27/323

(Continued)

*Primary Examiner* — Sanjiv D. Patel
(74) *Attorney, Agent, or Firm* — Birch, Stewart, Kolasch & Birch, LLP

(57) ABSTRACT

A viewing angle switchable display device can include a display panel including a plurality of sub-pixels, where each sub-pixel has a first emission area and a second emission area. The display device can further include a lens over the display panel and corresponding to the second emission area, wherein a size of the second emission area is smaller than a size of the first emission area.

16 Claims, 11 Drawing Sheets

(51) Int. Cl.
  *G06F 3/044* (2006.01)
  *H10K 59/121* (2023.01)
  *H10K 59/35* (2023.01)
  *H10K 59/40* (2023.01)
  *H10K 59/80* (2023.01)

(52) U.S. Cl.
  CPC ......... *H10K 59/121* (2023.02); *H10K 59/352* (2023.02); *H10K 59/353* (2023.02); *H10K 59/40* (2023.02); *H10K 59/8791* (2023.02); *G09G 2300/0439* (2013.01); *G09G 2300/0819* (2013.01); *G09G 2300/0842* (2013.01); *G09G 2300/0861* (2013.01); *G09G 2310/08* (2013.01); *G09G 2320/068* (2013.01); *G09G 2330/023* (2013.01); *G09G 2354/00* (2013.01); *G09G 2358/00* (2013.01)

(56) References Cited

U.S. PATENT DOCUMENTS

| | | | |
|---|---|---|---|
| 2020/0083484 A1* | 3/2020 | Lee | H10K 59/122 |
| 2021/0043709 A1* | 2/2021 | Kim | H10K 59/126 |
| 2021/0273203 A1* | 9/2021 | Sano | H10K 50/858 |
| 2022/0301478 A1* | 9/2022 | Jeong | G09G 3/2003 |

FOREIGN PATENT DOCUMENTS

| | | |
|---|---|---|
| KR | 10-2015-0061558 A | 6/2015 |
| KR | 10-2020-0075597 A | 6/2020 |

\* cited by examiner

VIEWING ANGLE SWITCHABLE DISPLAY DEVICE

CROSS-REFERENCE TO RELATED APPLICATION

The present application claims priority to Korean Patent Application No. 10-2021-0192432 filed on Dec. 30, 2021 in the Republic of Korea, the entire contents of which are hereby expressly incorporated by reference into the present application.

BACKGROUND OF THE DISCLOSURE

Field of the Disclosure

The present disclosure relates to a display device, and more particularly, to a viewing angle switchable display device.

Discussion of the Related Art

As the information society is in progress, a demand for display devices of displaying images increases in various forms, and flat panel display devices (FPD) such as liquid crystal display devices (LCD) and organic light-emitting diode display devices (OLED) have been developed and applied to various fields.

Among the flat panel display devices, the organic light-emitting diode display devices, which are also referred to as organic electroluminescent display devices, emit light due to the radiative recombination of an exciton after forming the exciton from an electron and a hole by injecting charges into a light-emitting layer between a cathode for injecting electrons and an anode for injecting holes in a light-emitting diode.

The organic light-emitting diode display device can be formed on a flexible substrate such as plastic. In addition, because it is self-luminous, the organic light-emitting diode display device has an excellent contrast ratio and an ultra thin thickness, and has a response time of several micro seconds, and thus there are advantages in displaying moving images without delays. The organic light-emitting diode display device also has a wide viewing angle and is stable under low temperatures. Since the organic light-emitting diode display device can be driven by low voltage of direct current (DC) 5V to 15V, it is easy to design and manufacture driving circuits.

As mentioned above, although there is no limit to the viewing angle of the organic light-emitting diode display device, it can be desirable to limit the viewing angle for reasons of privacy protection and information protection. This need can be further increased when portable information technology (IT) devices such as tablet PCs and notebook computers are used.

Meanwhile, IT devices are used while the user carries them for a long time. Since the capacity of the battery is limited, it is also needed to reduce power consumption.

SUMMARY OF THE DISCLOSURE

Accordingly, the present disclosure is directed to a viewing angle switchable display device that substantially obviates one or more of the problems due to limitations and disadvantages described above.

More specifically, the present disclosure is to provide a viewing angle switchable display device capable of being driven with low power.

Additional features and aspects will be set forth in the description that follows, and in part will be apparent from the description, or can be learned by practice of the present disclosure provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, a viewing angle switchable display device includes a display panel including a plurality of sub-pixels, each sub-pixel having a first emission area and a second emission area; a lens over the display panel and corresponding to the second emission area, wherein a size of the second emission area is smaller than a size of the first emission area.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION OF THE EMBODIMENTS

Reference will now be made in detail to aspects of the disclosure, an exemplary embodiment of which is illustrated in the accompanying drawings. Further, all the components of each viewing angle switchable display device according to all embodiments of the present disclosure are operatively coupled and configured.

Figure 1:
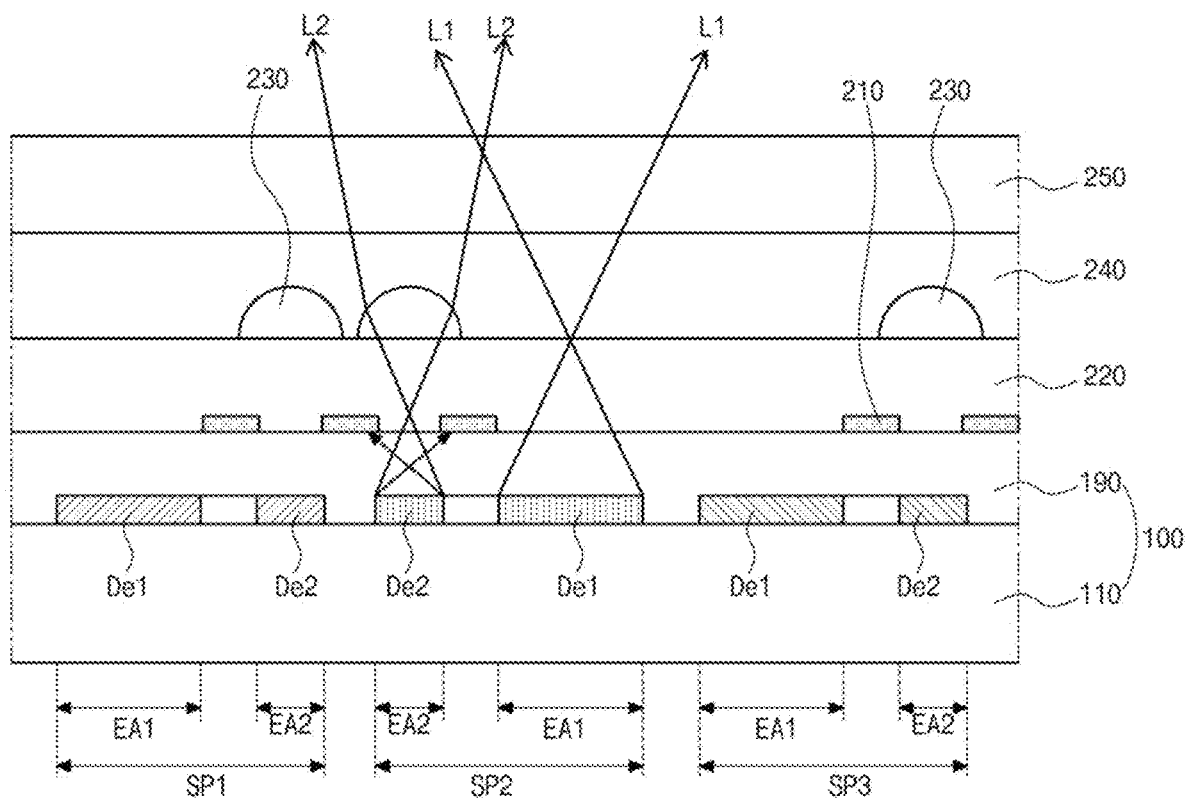
FIG. 1 is a schematic cross-sectional view of a viewing angle switchable display device according to an embodiment of the present disclosure.

FIG. 1 is a schematic cross-sectional view of a viewing angle switchable display device according to an embodiment of the present disclosure.

Referring to FIG. 1, the viewing angle switchable display device according to the embodiment of the present disclosure can include a display panel 100, light-blocking patterns 210, an optical gap layer 220, lenses 230, a planarization layer 240, and a polarization layer 250.

The display panel 100 can include a substrate 110, first and second light-emitting diodes De1 and De2, and an encapsulation layer 190.

Here, first, second, and third sub-pixels SP1, SP2, and SP3 can be defined on the substrate 110. Each of the first, second, and third sub-pixels SP1, SP2, and SP3 can have a first emission area EA1 and a second emission area EA2. The second emission area EA2 can have a larger size than the first emission area EA1.

The first light-emitting diode De1 can be provided in the first emission area EA1, and the second light-emitting diode De2 can be provided in the second emission area EA2.

The first, second, and third sub-pixels SP1, SP2, and SP3 can be red, green, and blue sub-pixels, respectively. Accordingly, the first and second light-emitting diodes De1 and De2 of the first sub-pixel SP1 can emit red light, the first and second light-emitting diodes De1 and De2 of the second sub-pixel SP2 can emit green light, and the first and second light-emitting diodes De1 and De2 of the third sub-pixel SP3 can emit blue light.

Next, the encapsulation layer 190 having a flat top surface can be provided on the first and second light-emitting diodes De1 and De2 to protect the first and second light-emitting diodes De1 and De2 from moisture and oxygen.

The specific configuration of the display panel 100 will be described in detail later.

The light-blocking patterns 210 can be provided on the display panel 100, more specifically, on the encapsulation layer 190. The light-blocking patterns 210 can be formed to substantially correspond to the second emission areas EA2 of the first, second, and third sub-pixels SP1, SP2, and SP3. The light-blocking patterns 210 may not be formed over the first emission areas EA1 of the first, second, and third sub-pixels SP1, SP2, and SP3. Specifically, the light-blocking patterns 210 can be formed around the second emission areas EA2 and can correspond to peripheries of the second emission areas EA2.

The light-blocking patterns 210 can be a black matrix and can be formed of a black resin or chromium oxide. Alternatively, the light-blocking patterns 210 can be touch electrodes and can be formed of metal. In this case, the touch electrodes can include a plurality of transmitter electrodes and a plurality of receiver electrodes crossing each other, and a touch can be detected from the amount of change in capacitance between the plurality of transmitter electrodes and the plurality of receiver electrodes.

The optical gap layer 220 can be provided on the light-blocking patterns 210. The optical gap layer 220 can secure an optical gap between the second light-emitting diodes De2 and the lenses 230, so that light from the second light-emitting diodes De2 can be refracted in a predetermined direction by the lenses 230, thereby improving the efficiency of the lenses 230. The optical gap layer 220 can have a thickness of several to several tens of and can be formed of an organic insulating material.

For example, the optical gap layer 220 can be formed of photo acryl, benzocyclobutene (BCB), polyimide (PI), or polyamide (PA), but embodiments are not limited thereto.

The lenses 230 can be provided on the optical gap layer 220. The lenses 230 can be hemispherical lenses and can overlap the light-blocking patterns 210. The lenses 230 can be disposed to correspond to the second emission areas EA2 of the first, second, and third sub-pixels SP1, SP2, and SP3, respectively. No lenses can be provided over the first emission areas EA1 of the first, second, and third sub-pixels SP1, SP2, and SP3.

Accordingly, a first light L1 emitted from the first light-emitting diode De1 of each sub-pixel SP1, SP2, and SP3 can be output substantially without limiting a viewing angle. On the other hand, a second light L2 emitted from the second light-emitting diode De2 of each sub-pixel SP1, SP2, and SP3 can be output at a specific angle by the lens 230, thereby limiting a viewing angle.

The planarization layer 240 can be provided on the lenses 230 to protect the lenses 230. The planarization layer 240 can be formed of an organic insulating material and can have a flat top surface. A refractive index of the planarization layer 240 can be smaller than refractive indexes of the lenses 230.

For example, the planarization layer 240 can be formed of photo acryl, benzocyclobutene (BCB), polyimide (PI), or polyamide (PA), but embodiments are not limited thereto.

The polarization layer 250 can be provided on the planarization layer 240. The polarization layer 250 can include a linear polarization layer and a retardation layer and can serve to prevent external light reflected by the display panel 100 from being output to the outside again by changing the polarization state of the external light incident on the display panel 100.

The display panel of the viewing angle switchable display device according to the embodiment of the present disclosure will be described with reference to FIG. 2.

Figure 2:
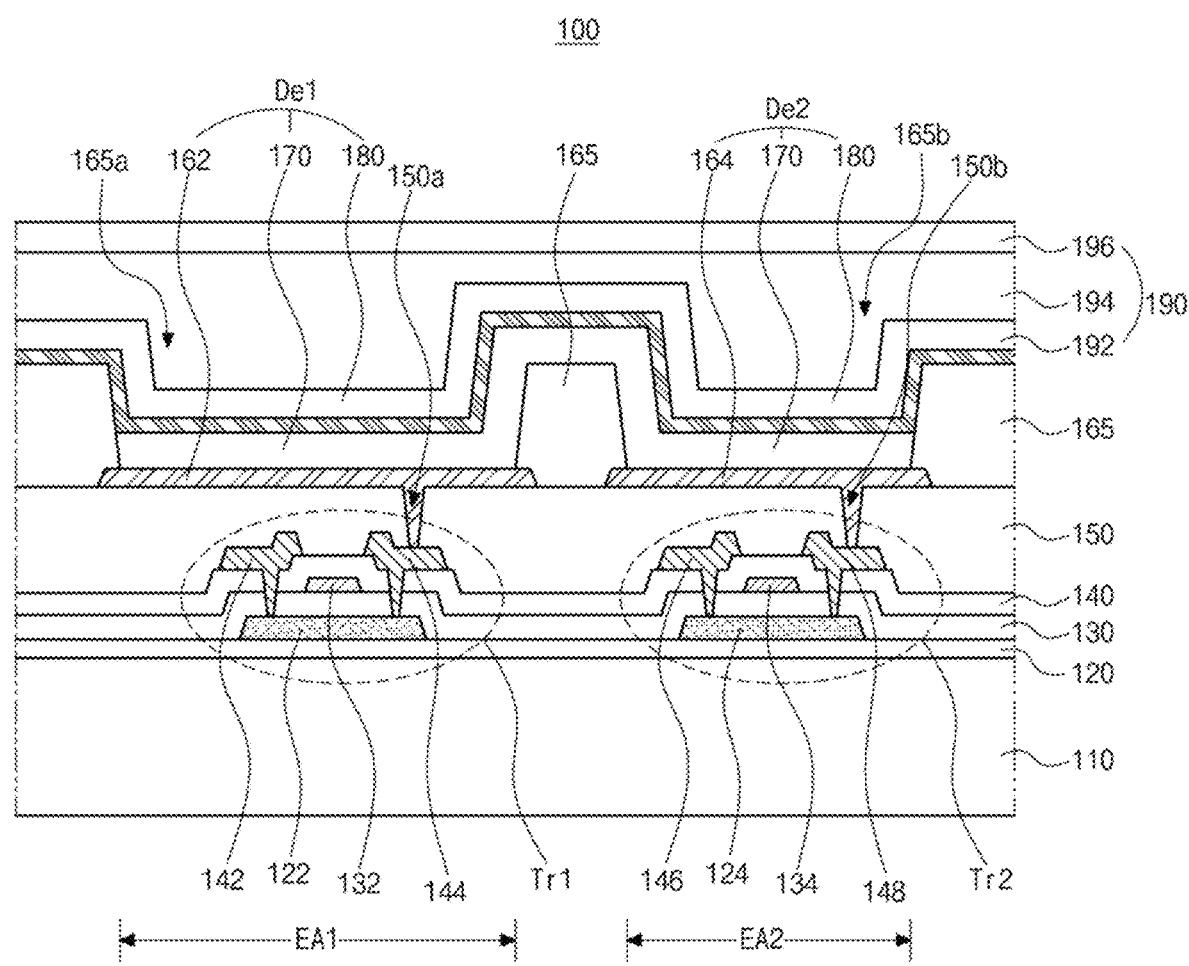
FIG. 2 is a schematic cross-sectional view of the display panel of the viewing angle switchable display device according to the embodiment of the present disclosure.

FIG. 2 is a schematic cross-sectional view of the display panel of the viewing angle switchable display device according to the embodiment of the present disclosure and shows one sub-pixel.

Referring to FIG. 2, the display panel 100 of the viewing angle switchable display device according to the embodiment of the present disclosure can include the substrate 110, first and second thin film transistors Tr1 and Tr2, the first and second light-emitting diodes De1 and De2, and the encapsulation layer 190.

Specifically, each sub-pixel can include the first emission area EA1 and the second emission area EA2 on the substrate 110. Here, the first emission area EA1 is larger than the second emission area EA2. The substrate 110 can be a glass substrate or a plastic substrate. For example, polyimide (PI) can be used for the plastic substrate, but embodiments are not limited thereto.

A buffer layer 120 can be formed on the substrate 110. The buffer layer 120 can be disposed over substantially an entire surface of the substrate 110. The buffer layer 120 can be formed of an inorganic material such as silicon oxide (SiO$_2$) or silicon nitride (SiNx), and can have a single-layer structure or a multiple-layer structure.

First and second semiconductor layers 122 and 124 can be patterned and formed on the buffer layer 120 in the first and second emission areas EA1 and EA2, respectively.

The first and second semiconductor layers 122 and 124 can be formed of an oxide semiconductor material. In this case, shield patterns can be further formed under the first and second semiconductor layers 122 and 124. The shield patterns can block light incident on the first and second semiconductor layers 122 and 124, thereby preventing the first and second semiconductor layers 122 and 124 from being degraded due to the light.

Alternatively, the first and second semiconductor layers 122 and 124 can be formed of polycrystalline silicon. In this case, both ends of the first and second semiconductor layers 122 and 124 can be doped with impurities.

A gate insulation layer 130 of an insulating material can be formed on the first and second semiconductor layers 122 and 124 over substantially the entire surface of the substrate 110. The gate insulation layer 130 can be formed of an inorganic insulating material such as silicon oxide (SiO$_2$) or silicon nitride (SiNx).

Here, when the first and second semiconductor layers 122 and 124 are formed of an oxide semiconductor material, the gate insulation layer 130 can be formed of silicon oxide (SiO$_2$). Alternatively, when the first and second semiconductor layers 122 and 124 are formed of polycrystalline, the gate insulation layer 130 can be formed of silicon oxide (SiO$_2$) or silicon nitride (SiNx).

Next, first and second gate electrodes 132 and 134 of a conductive material such as metal can be formed on the gate insulation layer 130 to correspond to the first and second semiconductor layers 122 and 124, respectively. In addition, a gate line can be formed on the gate insulation layer 130, and the gate line can extend in a first direction.

Meanwhile, in the embodiment of the present disclosure, the gate insulation layer 130 can be formed over substantially the entire surface of the substrate 110. However, the gate insulation layer 130 can be patterned to have the same shape as the first and second gate electrodes 132 and 134.

An interlayer insulation layer 140 of an insulating material can be formed on the first and second gate electrodes 132 and 134 over substantially the entire surface of the substrate 110. The interlayer insulation layer 140 can be formed of an inorganic insulating material such as silicon oxide (SiO$_2$) or silicon nitride (SiNx) or can be formed of an organic insulating material such as photo acryl or benzocyclobutene.

The interlayer insulation layer 140 can have contact holes exposing top surfaces of both ends of each of the first and second semiconductor layers 122 and 124. The contact holes can also be formed in the gate insulation layer 130.

Next, first source and first drain electrodes 142 and 144 and second source and second drain electrodes 146 and 148 of a conductive material such as metal can be formed on the interlayer insulation layer 140 in the first and second emission areas EA1 and EA2, respectively. In addition, a data line and a power line, which can extend in a second direction crossing the first direction, can be formed on the interlayer insulation layer 140.

The first source and first drain electrodes 142 and 144 can be in contact with the both ends of the first semiconductor layer 122 through the contact holes, and the second source and second drain electrodes 146 and 148 can be in contact with the both ends of the second semiconductor layer 124 through the contact holes. The line can cross the gate line to define a pixel region corresponding to each sub-pixel, and the power line providing a high potential voltage can be spaced apart from and parallel to the data line.

Meanwhile, the first semiconductor layer 122, the first gate electrode 132, the first source electrode 142, and the first drain electrode 144 can constitute the first thin film transistor Tr1, and the second semiconductor layer 124, the second gate electrode 134, the second source electrode 146, and the second drain electrode 148 can constitute the second thin film transistor Tr2.

One or more thin film transistors having the same structure as the first and second thin film transistors Tr1 and Tr2 can be further formed in each sub-pixel on the substrate 110, but embodiments are not limited thereto.

A protection layer 150 of an insulating material can be formed on the first source and first drain electrodes 142 and 144 and the second source and second drain electrodes 146 and 148 over substantially the entire surface of the substrate 110. The protection layer 150 can be formed of an organic insulating material such as photo acryl or benzocyclobutene. The protection layer 150 can have a flat top surface.

An insulation layer of an inorganic insulating material such as silicon oxide (SiO$_2$) or silicon nitride (SiNx) can be further formed under the protection layer 150, for example, between the first and second thin film transistors Tr1 and Tr2 and the protection layer 150.

The protection layer 150 can have first and second drain contact holes 150a and 150b exposing the first and second drain electrodes 144 and 148, respectively.

Next, first and second anode electrodes 162 and 164 of a conductive material having relatively high work function can be formed on the protection layer 150. The first anode electrode 162 can be disposed in the first emission area EA1 and can be in contact with the first drain electrode 144 through the first drain contact hole 150a. The second anode electrode 164 can be disposed in the second emission area EA2 and can be in contact with the second drain electrode 148 through the second drain contact hole 150b. Here, the first anode electrode 162 is larger than the second anode electrode 164. For example, the first anode electrode 162 has a larger size than the second anode electrode 164.

For example, the first and second anode electrodes 162 and 164 can be formed of a transparent conductive material such as indium tin oxide (ITO) or indium zinc oxide (IZO), but embodiments are not limited thereto.

Meanwhile, the display panel 100 according to the embodiment of the present disclosure can be a top-emission type, in which light from the first and second light-emitting diodes De1 and De2 is output toward a direction opposite the substrate 110. Accordingly, the first and second anode electrodes 162 and 164 can further include a reflection electrode or a reflection layer of a metal material having relatively high reflectance below the transparent conductive material. For example, the reflection electrode or reflection layer can be formed of an aluminum-palladium-copper (APC) alloy, silver (Ag) or aluminum (Al). In this case, the first and second anode electors 162 and 164 can have a triple-layer structure of ITO/APC/ITO, ITO/Ag/ITO or ITO/Al/ITO, but embodiments are not limited thereto.

A bank 165 of an insulating material can be formed on the first and second anode electrodes 162 and 164. The bank 165 can overlap and cover edges of the first and second anode electrodes 162 and 164. The bank 165 can have first and second openings 165a and 165b exposing the first and second anode electrodes 162 and 164, respectively.

At least a top surface of the bank 165 can be hydrophobic, and a side surface of the bank 165 can be hydrophobic or hydrophilic. The bank 165 can be formed of an organic insulating material having a hydrophobic property. Alternatively, the bank 165 can be formed of an organic insulating material having a hydrophilic property and can be subjected to a hydrophobic treatment.

In the present disclosure, the bank 165 can have a single-layer structure. However, the bank 165 can have a double-layer structure. For example, the bank 165 can include a hydrophilic bank of a lower side and a hydrophobic bank of an upper side.

Next, a light-emitting layer 170 can be formed on the first and second anode electrodes 162 and 164 exposed through the first and second openings 165a and 165b of the bank 165. A portion of the light-emitting layer 170 on the first anode electrode 162 and a portion of the light-emitting layer 170 on the second anode electrode 164 can be connected to each other and can be formed as one body. However, the present disclosure is not limited thereto. Alternatively, the portion of the light-emitting layer 170 on the first anode electrode 162 and the portion of the light-emitting layer 170 on the second anode electrode 164 can be separated from each other.

The light-emitting layer 170 can include a first charge auxiliary layer, a light-emitting material layer, and a second charge auxiliary layer sequentially stacked from a top surface of the first and second anode electrodes 162 and 164. The light-emitting material layer can be formed of any one of red, green, and blue luminescent materials, but embodiments are not limited thereto. The luminescent material can be an organic luminescent material, such as a phosphorescent compound or a fluorescent compound, or can be an inorganic luminescent material, such as a quantum dot.

The first charge auxiliary layer can be a hole auxiliary layer, and the hole auxiliary layer can include at least one of a hole injection layer (HIL) and a hole transport layer (HTL). In addition, the second charge auxiliary layer can be an electron auxiliary layer, and the electron auxiliary layer can include at least one of an electron injection layer (EIL) and an electron transport layer (ETL).

The light-emitting layer 170 can be formed through an evaporation process. In this case, in order to pattern the light-emitting layer 170 for each sub-pixel, a fine metal mask (FMM) can be used. Alternatively, the light-emitting layer 170 can be formed through a solution process. In this case, the light-emitting layer 170 can be provided only in the first and second openings 165a and 165b, and a height of the light-emitting layer 170 in a region adjacent to the bank 165 can rise as it gets closer to the bank 165.

A cathode electrode 180 of a conductive material, having relatively low work function, can be formed on the light-emitting layer 170 over substantially the entire surface of the substrate 110. The cathode electrode 180 can be formed of aluminum, magnesium, silver, or an alloy thereof. At this time, the cathode electrode 180 can have a relatively thin thickness such that light from the light-emitting layer 170 can be transmitted therethrough.

Alternatively, the cathode electrode 180 can be formed of a transparent conductive material such as indium gallium oxide (IGO), but embodiments are not limited thereto.

The first anode electrode 162, the light-emitting layer 170, and the cathode electrode 180 of the first emission area EA1 can constitute the first light-emitting diode De1, and the second anode electrode 164, the light-emitting layer 170, and the cathode electrode 180 of the second emission area EA2 can constitute the second light-emitting diode De2.

As described above, the display panel 100 according to the embodiment of the present disclosure can be a top-emission type, in which light from the first and second light-emitting diodes De1 and De2 is output toward a direction opposite the substrate 110, for example, is output through the cathode electrode 180. The top-emission type display panel can have a wider emission region than a bottom-emission type display panel of the same size, which can improve luminance and reduce power consumption.

The encapsulation layer 190 can be formed on the cathode electrode 180 over substantially the entire surface of the substrate 110. The encapsulation layer 190 can prevent moisture or oxygen from being introduced into the first and second light-emitting diodes De1 and De2 from the outside.

The encapsulation layer 190 can have a stacked structure of a first inorganic layer 192, an organic layer 194, and a second inorganic layer 196. Here, the organic layer 194 can be a layer that covers particles generated during a manufacturing process.

As described above, in the viewing angle switchable display device according to the embodiment of the present disclosure, each sub-pixel SP1, SP2, and SP3 can have the first and second emission areas EA1 and EA2, and the first and second emission areas EA1 and EA2 can be selectively driven by providing the lens 230 only in the second emission area EA2, thereby implementing a wide view mode and a narrow view mode.

The viewing angle characteristics in the first emission area EA1 and the second emission area EA2 will be described with reference to FIG. 3 and FIG. 4.

Figure 3:
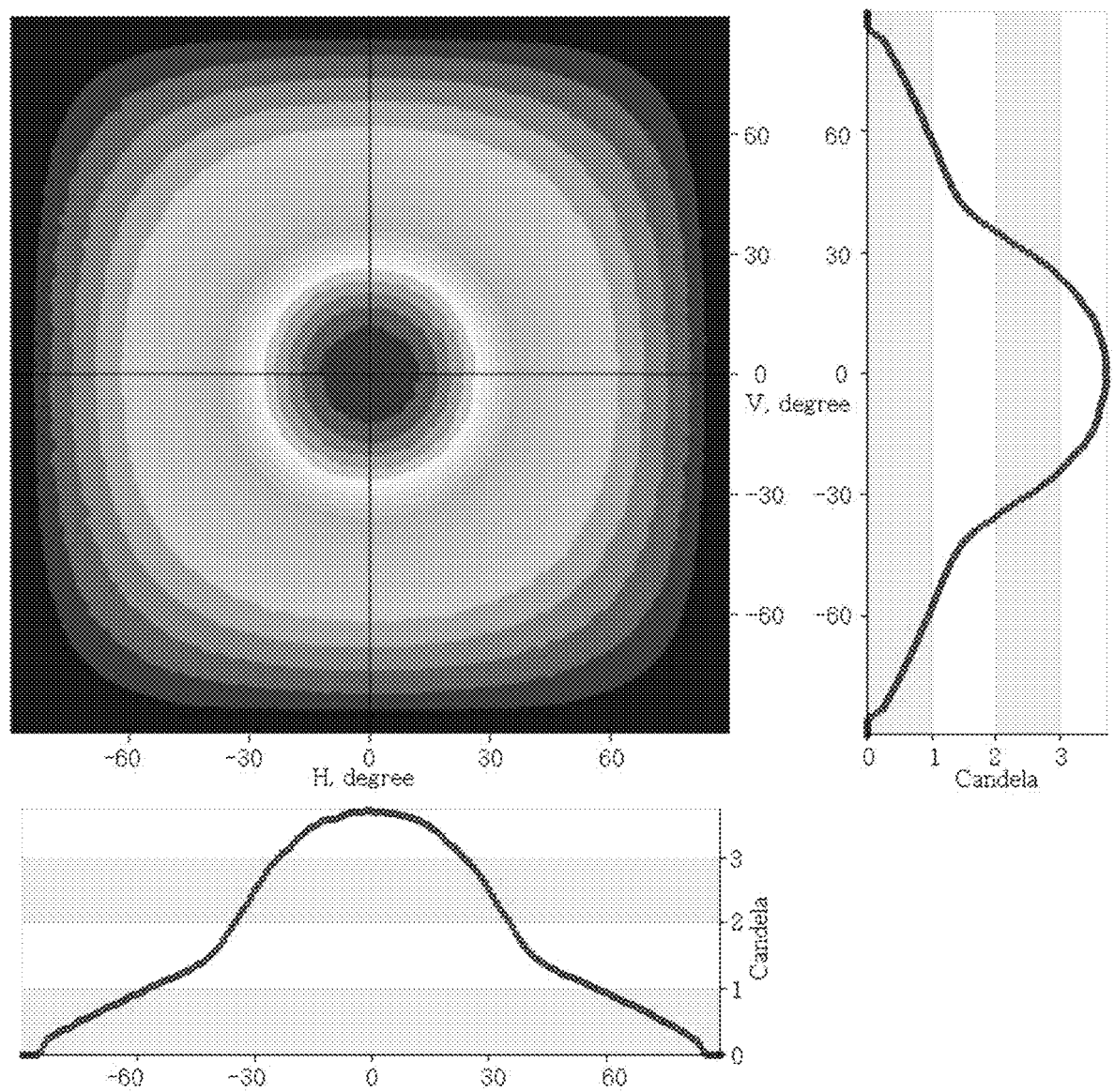
FIG. 3 is a view showing the optical profile with respect to the viewing angle of the first emission area of the viewing angle switchable display device according to the embodiment of the present disclosure.
Figure 4:
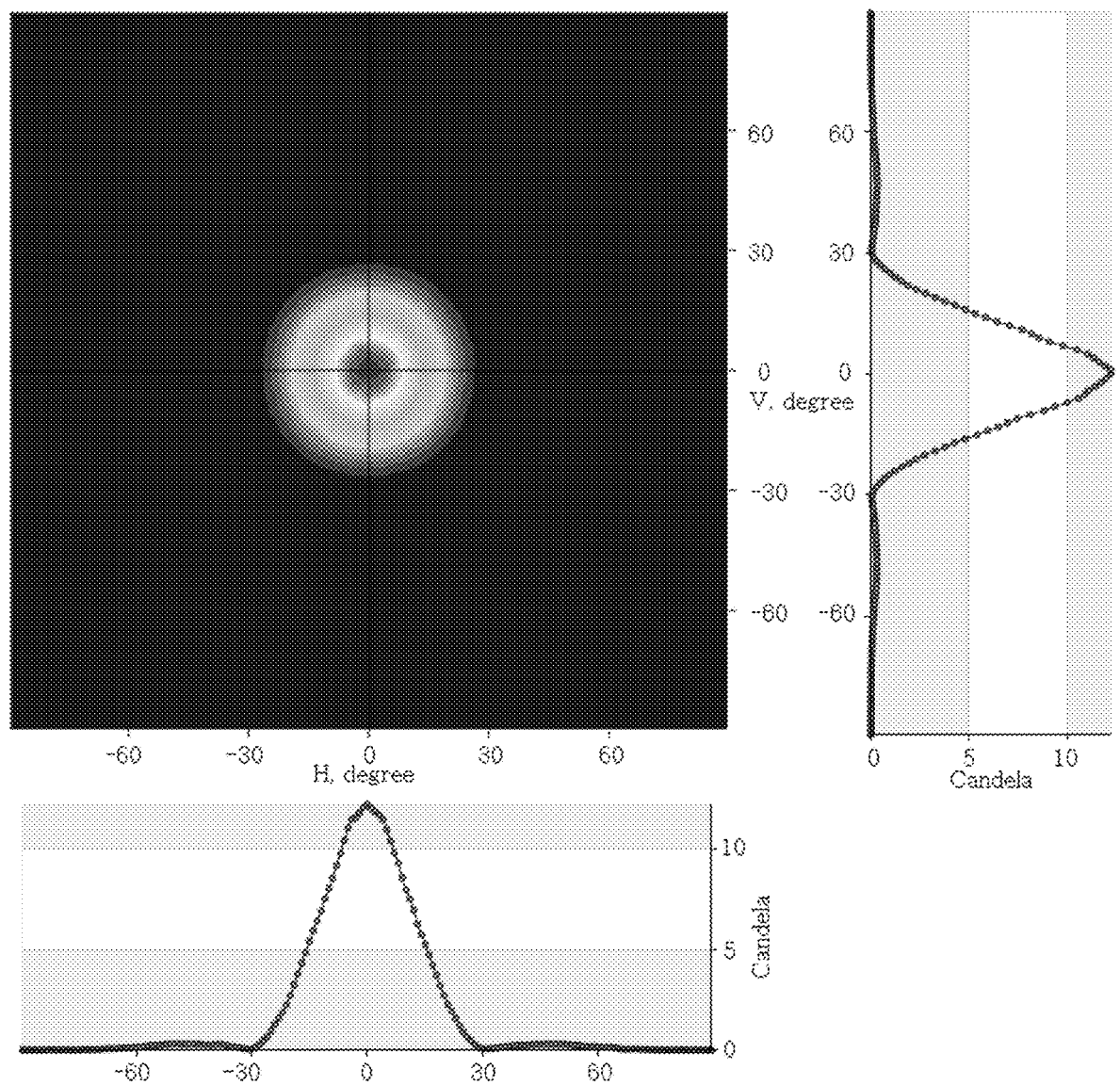
FIG. 4 is a view showing the optical profile with respect to the viewing angle of the second emission area of the viewing angle switchable display device according to the embodiment of the present disclosure.

FIG. 3 is a view showing the optical profile with respect to the viewing angle of the first emission area of the viewing angle switchable display device according to the embodiment of the present disclosure, and FIG. 4 is a view showing the optical profile with respect to the viewing angle of the second emission area of the viewing angle switchable display device according to the embodiment of the present disclosure. FIGS. 3 and 4 will be described with reference to FIG. 1 together.

Referring to FIGS. 3 and 4, the first emission area EA1 provided without the lens 230 can have a wide viewing angle of 60 degrees or more in both vertical and horizontal directions, for example, in the up and down direction and the left and right direction, while the second emission area EA2 provided with the lens 230 can have a narrow viewing angle of 30 degrees or less in both vertical and horizontal directions.

Accordingly, a wide view mode can be implemented by driving the first emission area EA1, and a narrow view mode can be implemented by driving the second emission area EA2.

Generally, in the case of a display for an IT device, a resolution of about 200 ppi and a luminance of about 400 nit are required. In order to satisfy the luminance condition, when the wide view mode is implemented, the first emission area EA1 without the lens 230 needs to have a predetermined area or more. On the other hand, when the narrow view mode is implemented, the luminance of the second emission area EA2 with the lens 230 can be increased compared to the same area without the lens 230 due to the light-collecting effect, and thus it is possible to decrease the size of the second emission area EA2. An increase in the luminance efficiency by the second emission area EA2 will be described with reference to FIG. 5.

Figure 5:
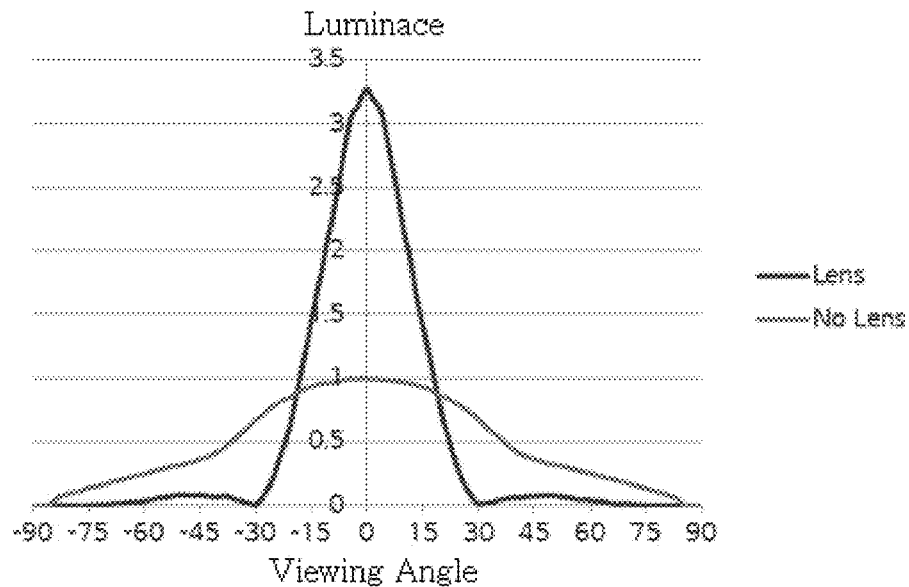
FIG. 5 is a graph showing the relative luminance with respect to the viewing angle of the second emission area of the viewing angle switchable display device according to the embodiment of the present disclosure.

FIG. 5 is a graph showing the relative luminance with respect to the viewing angle of the second emission area of the viewing angle switchable display device according to the embodiment of the present disclosure, and FIG. 5 will be described with reference to FIG. 1 together.

Referring to FIG. 5, the second emission area EA2 provided with the lens 230 has higher luminance than an emission area without a lens and having the same size as the second emission area EA2. It can be seen that the luminance efficiency of the second emission area EA2 is increased by about 327%.

Accordingly, the second emission area EA2 can be configured to have a smaller size than the first emission area EA1, thereby satisfying the luminance condition both in the wide view mode and the narrow view mode.

In this case, the driving voltage of the second emission area EA2 can be controlled by considering the increase in the luminance efficiency. For example, since the increase in the luminance efficiency is relatively high, the luminance condition can be satisfied even if the driving voltage is lowered. Therefore, the narrow view mode can be implemented with lower power than the wide view mode.

In addition, the luminance condition can be satisfied through the second emission area EA2 even when a low power mode is implemented. For example, the second emission area EA2 can be driven together while the first emission area EA1 is driven at a low luminance by lowering the driving voltage, thereby satisfying the required luminance condition.

Specifically, in the wide view mode, only the first emission area EA1 can be driven at a first luminance by applying a first driving voltage, and in the narrow view mode, only the second emission area EA2 can be driven at the first luminance by applying a second driving voltage, which is lower than the first driving voltage. Further, in the low power mode, by applying the second driving voltage, the first emission area EA1 can be driven at a second luminance, which is lower than the first luminance, and the second emission area EA2 can be driven at the first luminance. For example, the first luminance can be 400 nit, and the second luminance can be 100 nit. However, the present disclosure is not limited thereto.

Accordingly, the power consumption can be lowered. Since the luminance and heat generation are decreased, the lifetimes of the first and second light-emitting diodes De1 and De2 can be increased.

A pixel structure of the viewing angle switchable display device according to the embodiment of the present disclosure will be described with reference to FIG. 6.

Figure 6:
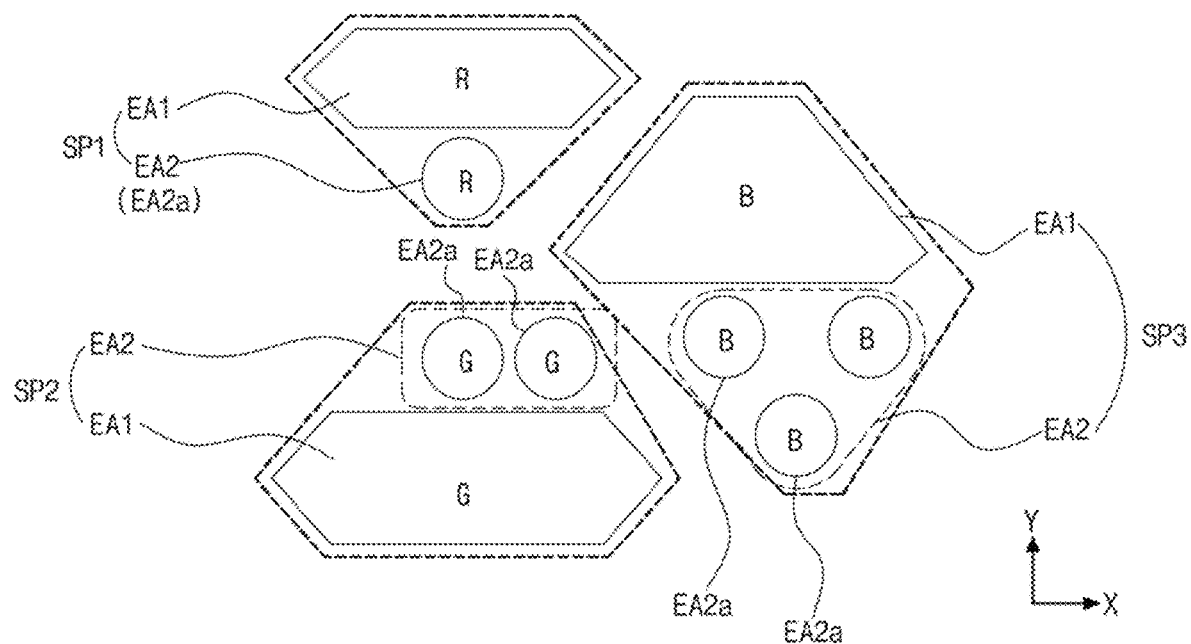
FIG. 6 is a plan view schematically illustrating a pixel of the viewing angle switchable display device according to the embodiment of the present disclosure.

FIG. 6 is a plan view schematically illustrating a pixel of the viewing angle switchable display device according to the embodiment of the present disclosure, and will be described with reference to FIG. 1 together.

Referring to FIG. 6, the pixel of the viewing angle switchable display device according to the embodiment of the present disclosure can include the first, second, and third sub-pixels SP1, SP2, and SP3, and the first, second, and third sub-pixels SP1, SP2, and SP3 can be red, green, and blue sub-pixels, respectively.

Each of the first, second, and third sub-pixels SP1, SP2, and SP3 can have the first emission area EA1 and the second emission area EA2, and the size of the first emission area EA1 can be larger than the size of the second emission area EA2. The second emission areas EA2 of the first, second, and third sub-pixels SP1, SP2, and SP3 each can include at least one sub-emission area EA2a, and one sub-emission area EA2a can correspond to one lens 230.

Here, the first and second sub-pixels SP1 and SP2 can be disposed along a Y direction, and the third sub-pixel SP3 can be disposed between the first and second sub-pixels SP1 and SP2 and along an X direction with respect to the first and second sub-pixels SP1 and SP2. At this time, the second emission areas EA2 of the first and second sub-pixels SP1 and SP2 can be disposed between the first emission area EA1 of the first sub-pixel SP1 and the first emission area EA1 of the second sub-pixel SP2. In addition, the first emission area EA1 of the third sub-pixel SP3 can be disposed adjacent to the second emission area EA2 of the first sub-pixel SP1, and the second emission area EA2 of the third sub-pixel SP3 can be disposed adjacent to the second emission area EA2 of the second sub-pixel SP2 in the X direction.

Each of the first, second, and third sub-pixels SP1, SP2, and SP3 can have substantially a hexagonal shape. However, the present disclosure is not limited thereto, and the first, second, and third sub-pixels SP1, SP2, and SP3 can have various shapes.

The first, second, and third sub-pixels SP1, SP2, and SP3 can have different sizes. The sizes of the first, second, and third sub-pixels SP1, SP2, and SP3 can be determined by considering the lifetime and luminous efficiency of a light-emitting diode provided at each sub-pixel. At this time, the shorter the wavelength of light, the higher the energy of light, and thus, the lifetime of a blue light-emitting diode is the shortest and the lifetime of the red light-emitting diode is the longest. Accordingly, in order to make the lifetimes uniform, the size of the second sub-pixel SP2 can be larger than the size of the first sub-pixel SP1 and smaller than the size of the third sub-pixel SP3.

For example, the area ratio of the first, second, and third sub-pixels SP1, SP2, and SP3 can be 1:2:3. In addition, the area ratio of the first emission areas EA1 of the first, second, and third sub-pixels SP1, SP2, and SP3 can also be 1:2:3, and the area ratio of the second emission areas EA2 of the first, second, and third sub-pixels SP1, SP2, and SP3 can also be 1:2:3. Accordingly, the number of sub-emission areas EA2a of the second emission area EA2 of the second sub-pixel SP2 can be more than the number of sub-emission areas EA2a of the second emission area EA2 of the first sub-pixel SP1 and less than the number of sub-emission areas EA2a of the second emission area EA2 of the third sub-pixel SP3. Specifically, the second emission area EA2 of the first sub-pixel SP1 can have one sub-emission area EA2a, the second emission area EA2 of the second sub-pixel SP2 can have two sub-emission areas EA2a, and the second emission area EA2 of the third sub-pixel SP3 can have three sub-emission areas EA2a. However, the present disclosure is not limited thereto.

In the viewing angle switchable display device according to the embodiment of the present disclosure, the wide view mode, the narrow view mode, and the low power mode can be implemented by independently driving the first and second emission areas EA1 and EA2 of each sub-pixel SP1, SP2, and SP3.

The sub-pixel and operation of the viewing angle switchable display device according to the embodiment of the present disclosure will be described with reference to FIGS. 7 to 9.

Figure 7:
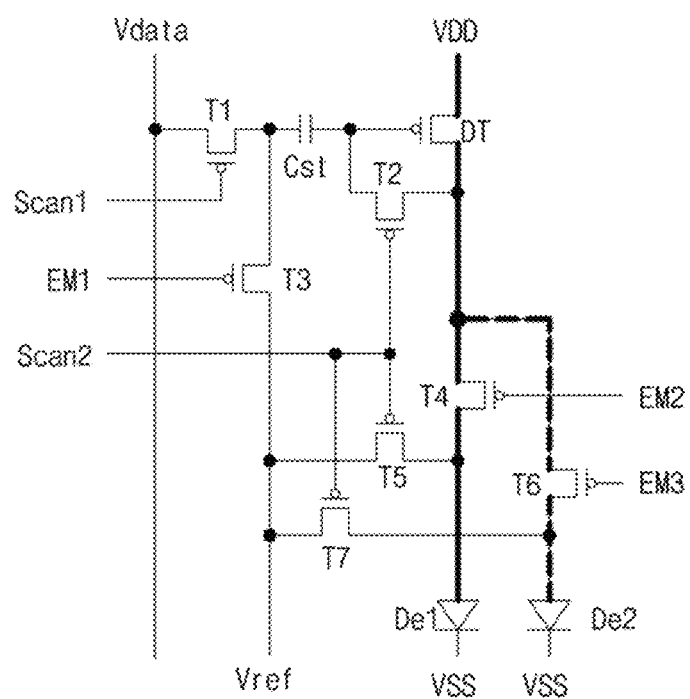
FIG. 7 is a circuit diagram showing a sub-pixel of the viewing angle switchable display device according to the embodiment of the present disclosure.
Figure 8:
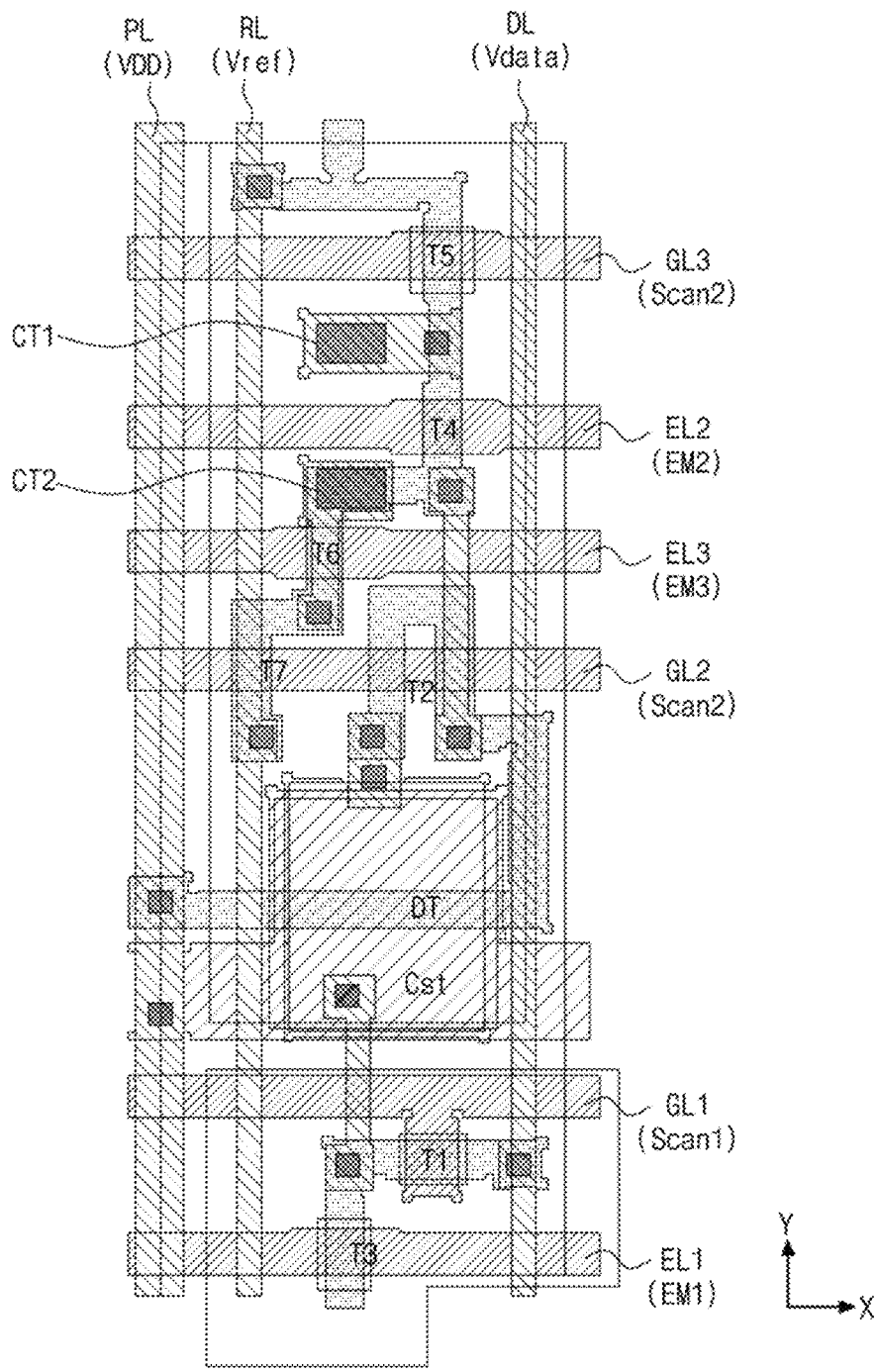
FIG. 8 is a plan view schematically illustrating the sub-pixel of the viewing angle switchable display device according to the embodiment of the present disclosure.

FIG. 7 is a circuit diagram showing a sub-pixel of the viewing angle switchable display device according to the embodiment of the present disclosure, and FIG. 8 is a plan view schematically illustrating the sub-pixel of the viewing angle switchable display device according to the embodiment of the present disclosure. FIGS. 7 and 8 will be described with reference to FIG. 1 together.

Referring to FIG. 7 and FIG. 8, in the viewing angle switchable display device according to the embodiment of the present disclosure, first, second, and third gate lines GL1, GL2, and GL3 and first, second, and third emission lines EL1, EL2, and EL3 can extend in the X direction, and a data line DL, a reference line RL, and a power line PL can extend in the Y direction. The data line DL, the reference line RL, and the power line PL can cross the first, second, and third gate lines GL1, GL2, and GL3 and the first, second, and third emission lines EL1, EL2, and EL3 to thereby define the sub-pixel.

The first gate line GL1 can transmit a first gate signal Scan1, and the second and third gate lines GL2 and GL3 can transmit a second gate signal Scan2. The first, second, and third emission lines EL1, EL2, and EL3 can transmit first, second, and third emission signals EM1, EM2, and EM3, the data line DL can transmit a data signal Vdata, the reference line RL can transmit a reference signal Vref, and the power line PL can transmit a high potential voltage VDD.

The sub-pixel of the viewing angle switchable display device according to the embodiment of the present disclosure can include a driving transistor DT, first, second, third, fourth, fifth, sixth, and seventh transistors T1, T2, T3, T4, T5, T6, and T7, a storage capacitor Cst, and first and second light-emitting diodes De1 and De2.

For example, the driving transistor DT and the first, second, third, fourth, fifth, sixth, and seventh transistors T1, T2, T3, T4, T5, T6, and T7 can be P-type transistors.

The driving transistor DT can be switched according to a voltage of a first electrode of the storage capacitor Cst and can be connected to the high potential voltage VDD. The first transistor T1 can be switched according to the first gate signal Scan1 and can be connected to the data signal Vdata. The second transistor T2 can be switched according to the second gate signal Scan2 and can be connected to the driving transistor DT. The third transistor T3 can be switched according to the first emission signal EM1 and can be connected to the reference signal Vref. The fourth transistor T4 can be switched according to the second emission signal EM2 and can be connected to the driving transistor DT. The fifth transistor T5 can be switched according to the second gate signal Scan2 and can be connected to the reference signal Vref and the fourth transistor T4. The sixth transistor T6 can be switched according to the third emission signal EM3 and can be connected to the driving transistor DT. The seventh transistor T7 can be switched according to the second gate signal Scan2 and can be connected to the reference signal Vref and the sixth transistor T6.

The storage capacitor Cst can store the data signal Vdata and the threshold voltage Vth. The first electrode of the storage capacitor Cst can be connected to the driving transistor DT and the second transistor T2, and a second electrode of the storage capacitor Cst can be connected to the first transistor T1 and the third transistor T3.

The first light-emitting diode De1 can be connected between the fourth and fifth transistors T4 and T5 and a low potential voltage VSS to emit light with luminance proportional to a current of the driving transistor DT. The first light-emitting diode De1 can implement the wide view mode or the low power mode in the ON state and the narrow view mode in the OFF state.

The second light-emitting diode De2 can be connected between the sixth and seventh transistors T6 and T7 and the low potential voltage VSS to emit light with luminance proportional to the current of the driving transistor DT. The second light-emitting diode De2 can be disposed to correspond to at least one hemispherical lens and can implement the narrow view mode or the low power mode in the ON state.

The first light-emitting diode De1 can be connected to a first contact part CT1 between the fourth transistor T4 and the fifth transistor T5, and the second light-emitting diode De2 can be connected to a second contact part CT2 between the sixth transistor T6 and the seventh transistor T7.

Figure 9:
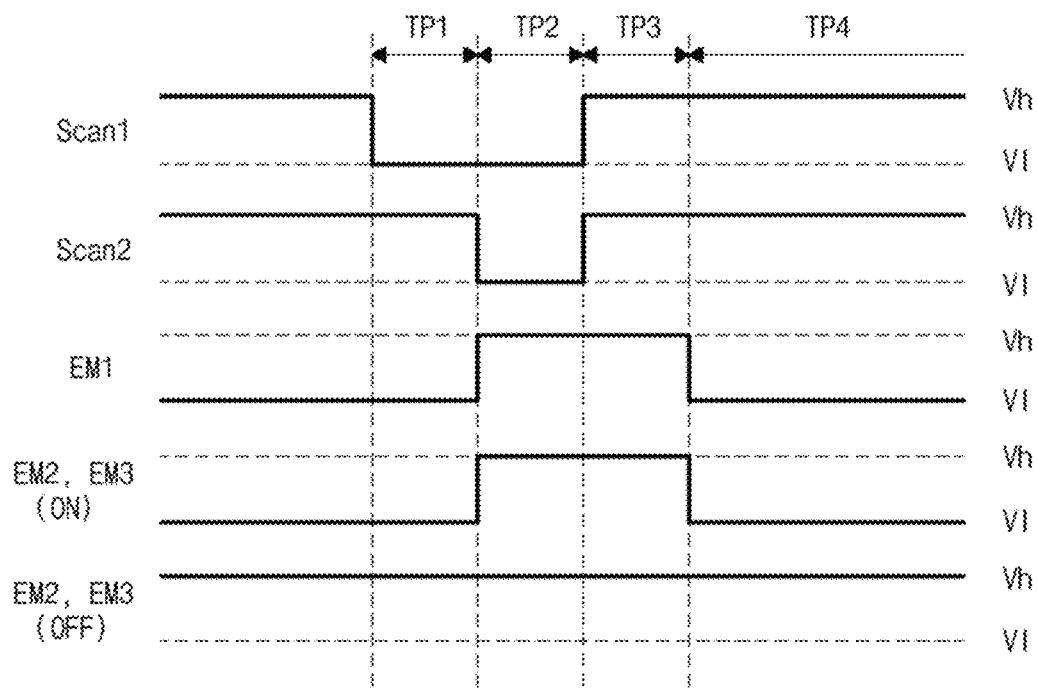
FIG. 9 is a waveform diagram showing the plurality of signals used in the sub-pixel of the viewing angle switchable display device according to the embodiment of the present disclosure.

FIG. 9 is a waveform diagram showing the plurality of signals used in the sub-pixel of the viewing angle switchable display device according to the embodiment of the present disclosure, and will be described with reference to FIG. 8 together.

Referring to FIG. 9, during a first time period TP1, which is an initialization period, the first gate signal Scan1 and the first emission signal EM1 can be a low level voltage Vl, and the second gate signal Scan2 can be a high level voltage Vh. Accordingly, the first and third transistors T1 and T3 can be turned on, and the second, fifth, and seventh transistors T2, T5, and T7 can be turned off, thereby initializing the storage capacitor Cst.

During a second time period TP2, which is a sensing period, the first gate signal Scan1 and the second gate signal Scan2 can be a low level voltage Vl, and the first emission signal EM1 can be a high level voltage Vh. Accordingly, the first, second, fifth, and seventh transistors T1, T2, T5, and T7 can be turned on, and the third transistor T3 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fifth, and seventh transistors T1, T2, T3, T5, and T7 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage Vl. Accordingly, the first, second, fifth, and seventh transistors T1, T2, T5, and T7 can be turned off, and the third transistor T3 can be turned on. A current for which the threshold voltage Vth is compensated can flow through the driving transistor DT, and the fourth and sixth transistors T4 and T6 can be independently turned on/off according to the second and third emission signals EM2 and EM3, so that the first and second light-emitting diodes De1 and De2 can emit light with luminance corresponding to the current flowing through the driving transistor DT.

A pixel arrangement structure of the viewing angle switchable display device according to the embodiment of the present disclosure including the sub-pixel will be described with reference to FIGS. 10 and 11.

Figure 10:
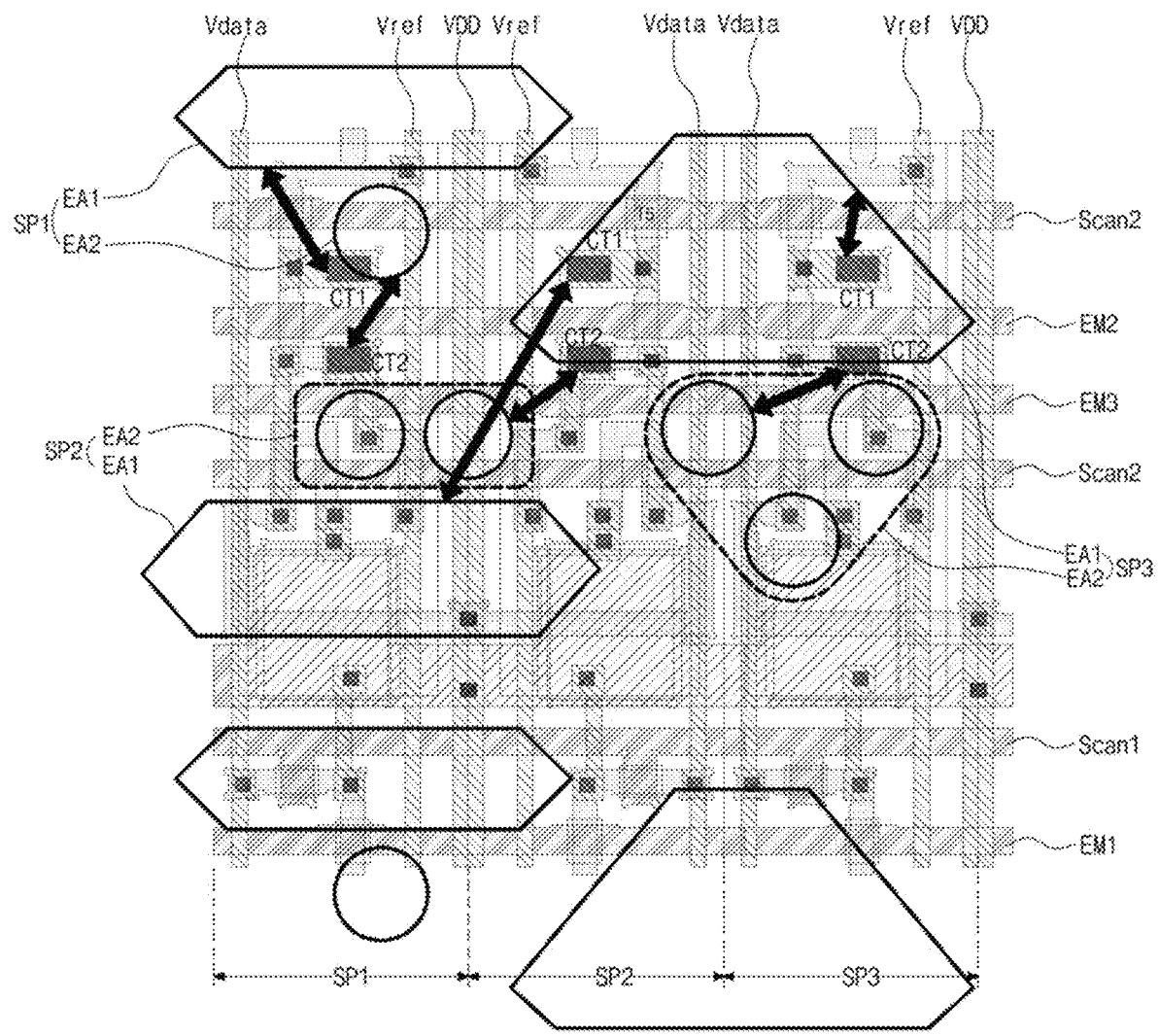
FIGS. 10 and 11 are views the pixel arrangement structure of the viewing angle switchable display device according to the embodiment of the present disclosure.
Figure 11:
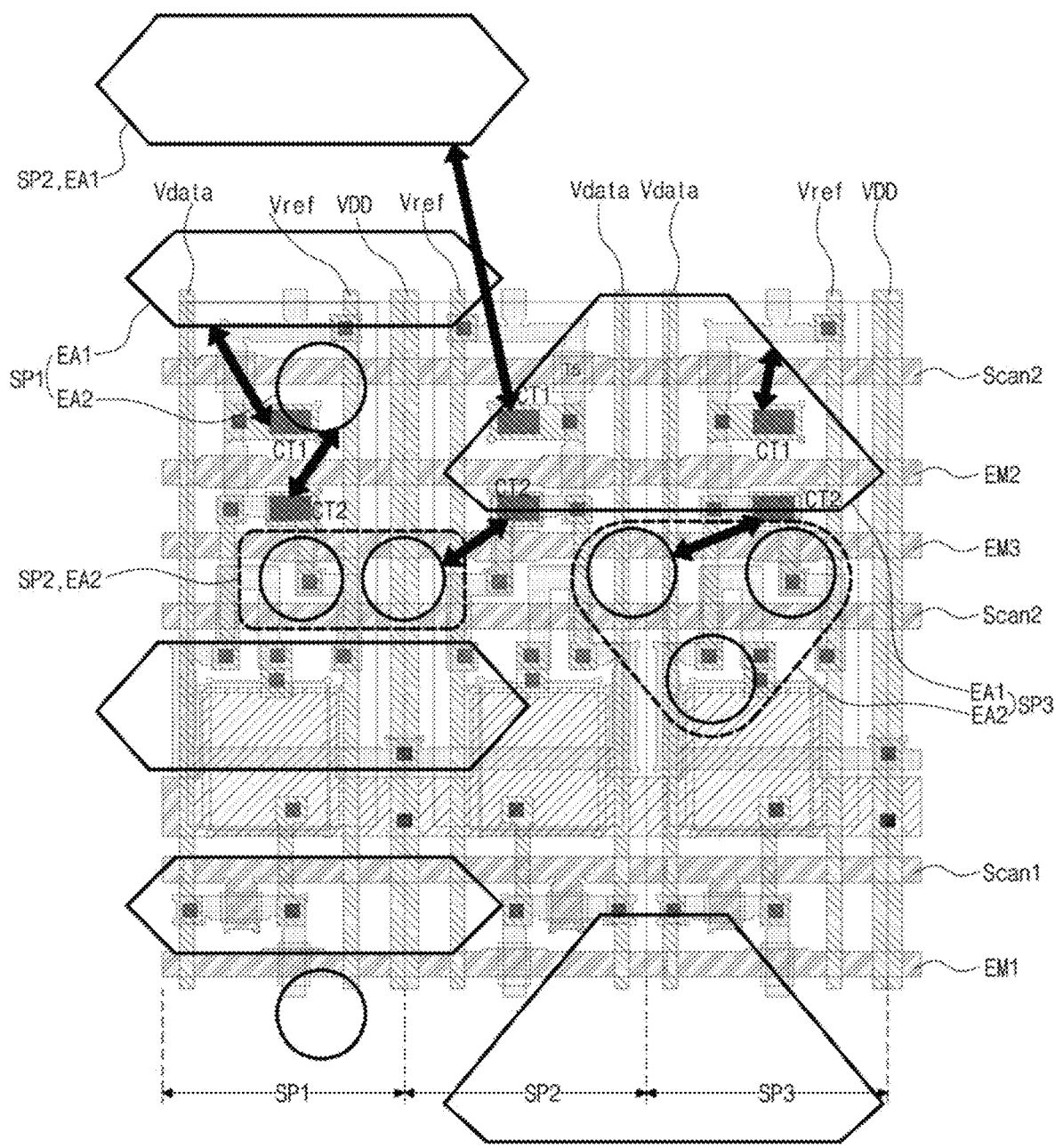

FIGS. 10 and 11 are views the pixel arrangement structure of the viewing angle switchable display device according to the embodiment of the present disclosure, and show the connection relationship between the contact part and the light-emitting diode of each sub-pixel, for example, the connection relationship between the contact part and the emission area. Here, the emission area corresponds to the anode electrode of the light-emitting diode. For convenience, each line uses the transmitted signal as the reference sign.

Referring to FIGS. 10 and 11, first, second, and third sub-pixels SP1, SP2, and SP3 can be sequentially disposed in the horizontal direction, and the second sub-pixel SP2 can be disposed between the first and third sub-pixels SP1 and SP3. The first sub-pixel SP1 and the third sub-pixel SP3 can have the same structure except for the first and second anode electrodes, and the second sub-pixel SP2 can have a symmetrical structure with the first sub-pixel SP1 and can also have a symmetrical structure with the third sub-pixel SP3 in the horizontal direction. For example, two sub-pixels having the same configuration as the first and second sub-pixels SP1 and SP2 symmetrical to each other can be repeatedly disposed.

The first contact part CT1 of the first sub-pixel SP1 can be connected to the first emission area EA1 of the first sub-pixel SP1, and the second contact part CT2 of the first sub-pixel SP1 can be connected to the second emission area EA2 of the first sub-pixel SP1. The first contact part CT1 of the second sub-pixel SP2 can be connected to the first emission area EA1 of the second sub-pixel SP2, and the second contact part CT2 of the second sub-pixel SP2 can be connected to the second emission area EA2 of the second sub-pixel SP2. The first contact part CT1 of the third sub-pixel SP3 can be connected to the first emission area EA1 of the third sub-pixel SP3, and the second contact part CT2 of the third sub-pixel SP3 can be connected to the second emission area EA2 of the third sub-pixel SP3.

At this time, as shown in FIG. 10, the second emission areas EA2 of the first and second sub-pixels SP1 and SP2 can be disposed between the first emission area EA1 of the first sub-pixel SP1 and the first emission area EA1 of the second sub-pixel SP2.

Alternatively, as shown in FIG. 11, the first and second emission areas EA1 and EA2 of the first sub-pixel SP1 can be disposed between the first emission area EA1 of the second sub-pixel SP2 and the second emission area EA2 of the second sub-pixel SP2. In this case, it is easier to design the pixel.

Meanwhile, as mentioned above, in the viewing angle switchable display device according to the embodiment of the present disclosure, the light-blocking patterns can be touch electrodes, which will be described in detail with reference to FIG. 12.

Figure 12:
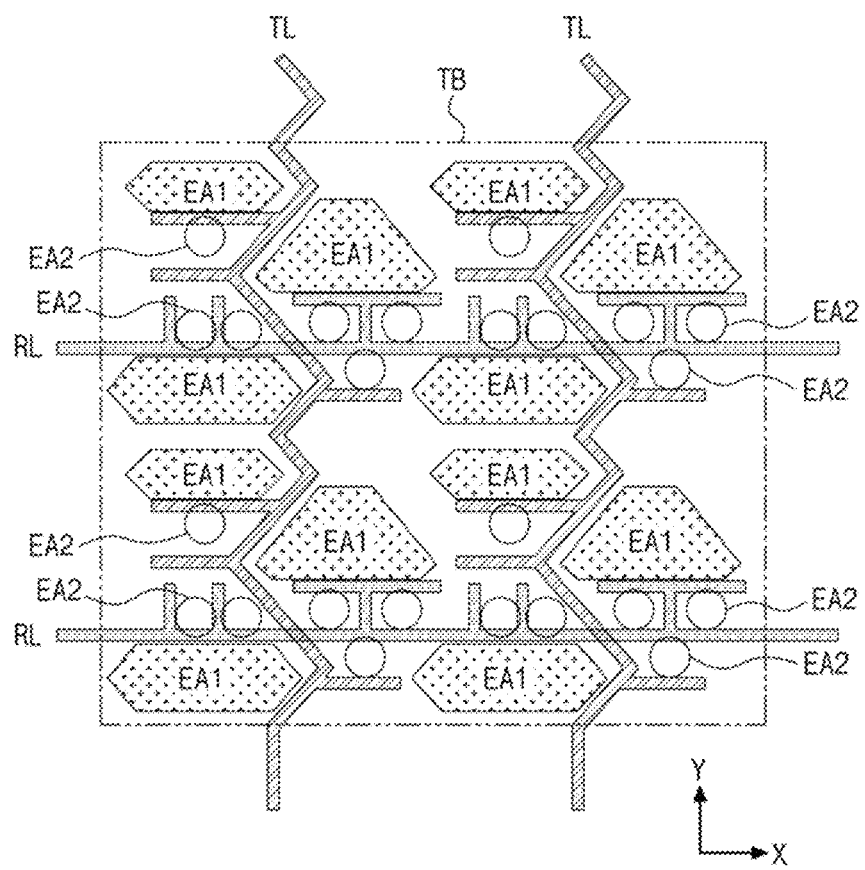
FIG. 12 is a plan view schematically illustrating the structure of light-blocking patterns of the viewing angle switchable display device according to the embodiment of the present disclosure.

FIG. 12 is a plan view schematically illustrating the structure of light-blocking patterns of the viewing angle switchable display device according to the embodiment of the present disclosure.

Referring to FIG. 12, the light-blocking pattern of the viewing angle switchable display device according to the embodiment of the present disclosure can be touch electrodes including a plurality of transmitter electrodes TL and a plurality of receiver electrodes RL.

At this time, in one touch block TB, the plurality of transmitter electrodes TL and the plurality of receiver electrodes RL can be formed to correspond to substantially the second emission areas EA2 such that each second emission area EA2 can be surrounded by the transmitter electrodes TL and/or the receiver electrodes RL. On the other hand, the plurality of transmitter electrodes TL and the plurality of receiver electrodes RL may not be formed to correspond to substantially the first emission areas EA1 and may not be formed between adjacent first emission areas EA1.

In this case, the transmitter electrode TL can extend in the Y direction and can be connected to the transmitter electrode TL of another touch block TB adjacent thereto, and the receiver electrode RL can extend in the X direction and can be connected to the receiver electrode RL of another touch block TB adjacent thereto.

As described above, the viewing angle switchable display device according to the embodiment of the present disclosure can use the touch electrodes TL and RL as the light-blocking patterns.

Since the viewing angle switchable display device according to the embodiment of the present disclosure includes the first emission area without a lens and the second emission area with a lens and a smaller size than the first emission area, it is possible to implement the wide view mode and the narrow view mode while satisfying the required luminance condition.

In addition, the low power mode can be implemented while satisfying the required luminance condition by driving both first and second emission areas with the lowered driving voltage.

Accordingly, the power consumption can be reduced, and the lifetimes of the light-emitting diodes can be improved.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A viewing angle switchable display device, comprising:
a display panel including a plurality of sub-pixels, each sub-pixel having a first emission area and a second emission area; and
a plurality of lenses over the display panel and corresponding to the second emission areas of the plurality of sub-pixels,
wherein a size of the second emission area is smaller than a size of the first emission area in each sub-pixel, and
wherein each of the first emission areas of the plurality of sub-pixels is spaced apart from the plurality of lenses and is disposed between two adjacent lenses of the plurality of lenses, and each of the first emission areas does not overlap any lens of the plurality of lenses.

2. The viewing angle switchable display device of claim 1, wherein in a wide view mode, a first driving voltage is applied to drive the first emission area at a first luminance,
wherein in a narrow view mode, a second driving voltage is applied to drive the second emission area at the first luminance,
wherein in a low power mode, the second driving voltage is applied to drive the first emission area at a second luminance and drive the second emission area at the first luminance, and
wherein the second driving voltage is lower than the first driving voltage, and the second luminance is lower than the first luminance.

3. The viewing angle switchable display device of claim 1, wherein the plurality of sub-pixels include first, second, and third sub-pixels, and
wherein the second sub-pixel is larger than the first sub-pixel, and is smaller than the third sub-pixel.

4. The viewing angle switchable display device of claim 3, wherein the second emission area includes at least one sub-emission area, and one of the plurality of lenses corresponds to the at least one sub-emission area.

5. The viewing angle switchable display device of claim 4, wherein a number of sub-emission areas of the second sub-pixel is greater than a number of sub-emission areas of the first sub-pixel, and is smaller than a number of sub-emission areas of the third sub-pixel.

6. The viewing angle switchable display device of claim 1, wherein the plurality of sub-pixels include first, second, and third sub-pixels,
wherein the first and second sub-pixels are disposed in a first direction, and the third sub-pixel is disposed in a second direction perpendicular to the first direction with respect to the first and second sub-pixels, and wherein the second emission areas of the first and second sub-pixels are disposed between the first emission area of the first sub-pixel and the first emission area of the second sub-pixel.

7. The viewing angle switchable display device of claim 6, wherein the first emission area of the third sub-pixel is disposed adjacent to the second emission area of the first sub-pixel in the second direction, and wherein the second emission area of the third sub-pixel is disposed adjacent to the second emission area of the second sub-pixel in the second direction.

8. The viewing angle switchable display device of claim 1, wherein each of the plurality of sub-pixels includes:

a driving transistor connected to a high potential voltage;

a first transistor configured to be switched according to a first gate signal and connected to a data signal;

a second transistor configured to be switched according to a second gate signal and connected to the driving transistor;

a third transistor configured to be switched according to a first emission signal and connected to a reference signal;

a fourth transistor configured to be switched according to a second emission signal and connected to the driving transistor;

a fifth transistor configured to be switched according to the second gate signal and connected to the reference signal and the fourth transistor;

a sixth transistor configured to be switched according to a third emission signal and connected to the driving transistor;

a seventh transistor configured to be switched according to the second gate signal and connected to the reference signal and the sixth transistor;

a storage capacitor having a first electrode connected to the driving transistor and the second transistor and a second electrode connected to the first and third transistors;

a first light-emitting diode connected between the fourth and fifth transistors and a low potential voltage and provided in the first emission area; and a second light-emitting diode connected between the sixth and seventh transistors and the low potential voltage and provided in the second emission area.

9. The viewing angle switchable display device of claim 8, wherein the plurality of sub-pixels include first, second, and third sub-pixels, wherein the first and second sub-pixels are disposed in a first direction, and the third sub-pixel is disposed in a second direction perpendicular to the first direction with respect to the first and second sub-pixels, and wherein the first and second emission areas of the first sub-pixel are disposed between the first emission area of the second sub-pixel and the second emission area of the second sub-pixel.

10. The viewing angle switchable display device of claim 9, wherein the first emission area of the first sub-pixel is disposed between the second emission area of the first sub-pixel and the first emission area of the second sub-pixel.

11. The viewing angle switchable display device of claim 1, wherein each of the plurality of lenses is a hemispherical lens.

12. The viewing angle switchable display device of claim 1, further comprising light-blocking patterns between the display panel and the plurality of lenses, wherein the light-blocking patterns correspond to peripheries of the second emission area.

13. The viewing angle switchable display device of claim 12, wherein the light-blocking patterns are touch electrodes including a plurality of transmitter electrodes and a plurality of receiver electrodes crossing each other.

14. The viewing angle switchable display device of claim 1, further comprising a polarization layer over the plurality of lenses and including a linear polarization layer and a retardation layer.

15. The viewing angle switchable display device of claim 1, further comprising a planarization layer over the plurality of lenses, wherein a thickness of a portion of the planarization layer overlapping the first emission area is greater than a thickness of a portion of the planarization layer overlapping the second emission area.

16. The viewing angle switchable display device of claim 1, wherein a size of each of the plurality of lenses is smaller than the size of the first emission area.

* * * * *